Sept. 2, 1958 E. N. SCHROEDER 2,850,649

DETECTOR CIRCUIT

Filed Dec. 29, 1955

INVENTOR.
EUGENE N. SCHROEDER
BY
Dewey J Cunningham
ATTORNEY

United States Patent Office 2,850,649

Patented Sept. 2, 1958

2,850,649

DETECTOR CIRCUIT

Eugene N. Schroeder, Vestal, N. Y., assignor to International Business Machines Corporation, New York, N. Y., a corporation of New York Application December 29, 1955, Serial No. 556,269

5 Claims. (Cl. 307—88.5)

The present invention relates to electrical circuit apparatus and particularly such an apparatus for detecting significant changes in level of an input signal.

An object of the invention is to provide an improved detector circuit.

Another object of this invention is to furnish means for producing unidirectional output signals for the positive going and negative going transients of an input signal.

A further object of the present invention is to provide an improved detector circuit as described above which is simple in construction and which may be comprised of solid state devices.

Other objects of the invention will be pointed out in the following description and claims and illustrated in the accompanying drawings, which disclose, by way of examples, the principle of the invention and the best mode, which has been contemplated, of applying that principle.

Figure 1:
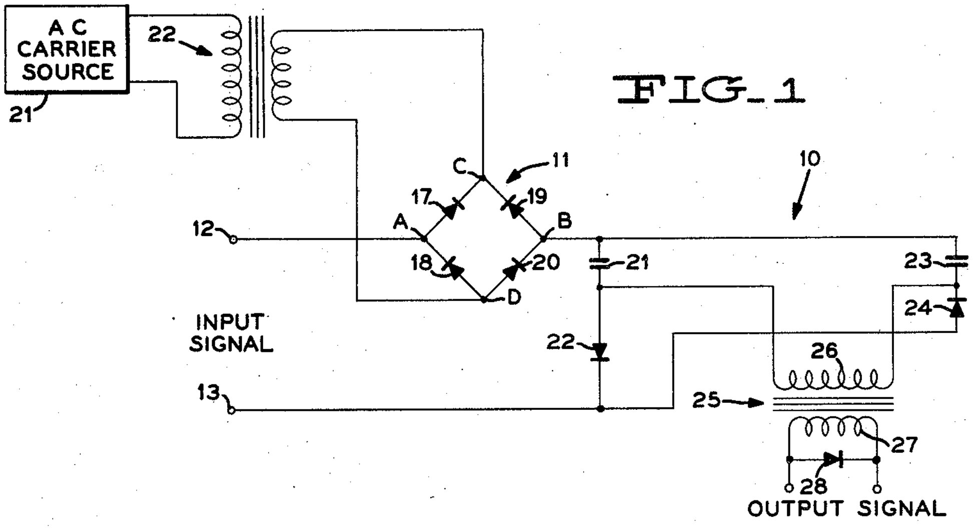
Fig. 1 is a schematic diagram of an embodiment of the invention.

Generally, the present invention discloses electrical detection apparatus for providing a uni-directional potential pulse output following the detection of significant changes in the level of an input potential signal with respect to a reference potential regardless of whether it is a unidirectional or bipolar variation. Further, if it is desired that the detection apparatus be responsive to bipolar variations or a pulse type input only, the frequency of which is known, a switching means may be placed between the input potential and the electrical detection apparatus of the present invention to effectively gate the input potential to the detector circuit for that purpose. The reference potential may be of any desired positive or negative potential or ground. The detector circuit is comprised of first and second parallel legs, each including a capacitor in series with a diode. The diode in one leg is oriented opposite to the diode in the other leg. In order to obtain an output signal, the primary of a transformer is connected between the legs, one end of the primary being connected between the capacitor and diode of the first leg and the other end being connected to a similar point of the second leg. The operation is such that for one input signal level, both capacitors will be charged in one direction, the capacitor in the first leg being charged through the diode in the first leg. The capacitor in the second leg will be charged through the transformer primary and the diode in the first leg. When the level of the input signal changes polarity with respect to a reference potential the switching device is closed, both capacitors discharge and recharge in the opposite direction. The second capacitor, therefore, discharges and charges in said opposite direction through the diode in the second leg. Since the diode in the first leg can no longer conduct, the capacitor in the first leg discharges and recharges in the opposite direction through the transformer primary and the diode in the second leg. This discharge and recharge produces an output signal at the secondary of the transformer. When the input signal returns to the first level, the opposite action occurs, producing another output signal from the transformer secondary. It will be noted that each output signal is unidirectional in nature.

Referring now to the drawings, the detector circuit is illustrated generally by reference numeral 10 and the switching device by reference numeral 11. An input signal is adapted to be supplied to terminals 12 and 13 and may be similar to that shown by way of example at (*b*) in Fig. 2. It will be seen that the input signal is bi-polar with respect to the reference level 14. That is, the portion 15 is positive with respect to the reference potential and the portion 16 is negative with respect to the reference potential. As previously stated, the particular reference potential used may be ground or any other desired potential.

The switching device 11 is adapted to periodically allow the potential at terminal 12 to appear at the input of the detector circuit 10 and is comprised of a plurality of diodes 17, 18, 19 and 20 which form a bridge. Terminal 12 is connected to point A which is common to the plate and cathode of diodes 17 and 18, respectively, while the plate and cathode of diodes 19 and 20 are common at point B and connected to one side of the detector circuit. An A. C. carrier source 21 supplies a carrier signal through a transformer 22 to the cathodes of diodes 17 and 19, which are commoned at a point C, and the plates of diodes 18 and 20, which are commoned at a point D. This carrier signal is shown in idealized fashion at (*a*) in Fig. 2. For the waveforms illustrated, the phase of the carrier signal, as shown, is identical with that supplied to point D, it being understood that the signal supplied to point C is 180° out of phase therewith. The carrier signal excursion is greater than that for the input signal.

The operation of switch 11 is such that when point D is positive with respect to point C, the potential appearing at point A appears at the output side of the switch at point B. When point C is positive with respect to point D, the detector circuit 10 looks back into a high impedance at point B which is in effect an open circuit.

The detector circuit 10 comprises a first leg, including a capacitor 21 in series with a diode 22, in parallel with a second leg which includes a capacitor 23 in series with a diode 24. It is seen that the diodes in the two legs are reversely oriented in that the plate of diode 22 is connected to its associated capacitor whereas the cathode of diode 24 is connected to its associated capacitor. The upper sides of both capacitors, as shown in the drawings, are connected to the output point B of switch 11. The detector circuit is closed by the connection of the cathode of diode 22 and the plate of diode 24 to input terminal 13. Terminal 13 may be connected to some predetermined reference potential or it may be connected such that it is 180° out of phase with the signal at terminal 12. Also the variation in potential may take place at terminal 13 with terminal 12 receiving some reference signal.

Detector 10 also includes a transformer 25 having a primary 26 and a secondary 27. One end of primary 26 is connected to a point intermediate capacitor 21 and diode 22 while the other end of the primary is connected to a point intermediate capacitor 23 and diode 24. The output signal indicating the occurrence of a positive going or negative going transient which appears at the terminals of secondary 27, there being a diode 28 connected across those last-named terminals to prevent overshoot.

Figure 2:
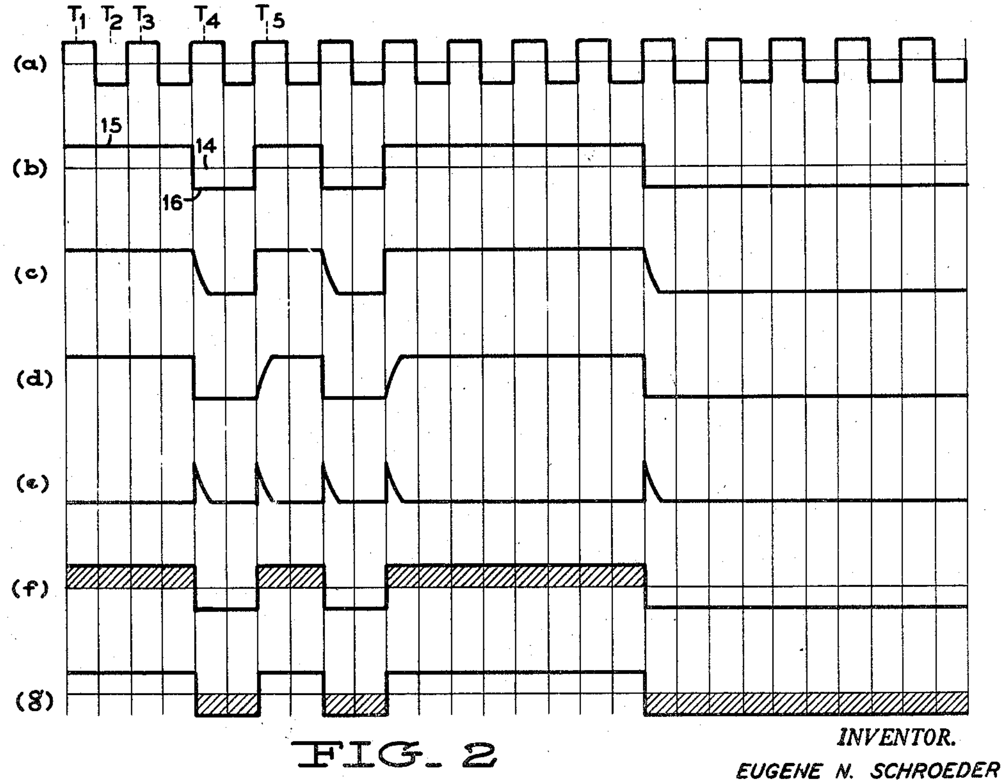
Fig. 2 shows a plurality of exemplary waveforms for the circuit shown in Fig. 1, these waveforms being idealized for simplicity in understanding.

The operation of the present invention will now be described in detail. Referring to Fig. 2, at time $T_1$ the input signal appearing at point A in Fig. 1 is relatively positive as shown at (*b*) in Fig. 2. Since point D is positive with respect to point C, a potential will exist at point B which is substantially equal to the input potential at point A. Therefore, the potential at point B is positive with respect to that appearing on the other input terminal 13. This allows capacitor 21 to be charged plus-minus through diode 22. Since diode 24 cannot conduct at this time, capacitor 23 will be charged plus-minus through primary 26 and diode 22. The condition of capacitors 21 and 23 is shown at (*c*) and (*d*), respectively, in Fig. 2, and the condition of diodes 22 and 24 is illustrated at (*f*) and (*g*), respectively. The cross-hatching in the waveforms at (*f*) and (*g*) indicates when a diode is capable of conducting in a forward direction. When the carrier from source 21 reverses polarity at time $T_2$, so that point D is negative with respect to point C, capacitors 21 and 23 look back into a high impedance at point B. Therefore, the charge on the capacitors remains constant except for leakage therein which in the present instance is negligible.

At time $T_3$, point D is again positive with respect to point C and the same input potential is applied to the capacitors. Since the potential again applied to point B is the same as that originally applied, substantially no change occurs at time $T_3$ in the condition of capacitors 21 and 23.

By time $T_4$, the input signal has changed from level 15 to level 16 and point D has again been made positive with respect to point C by the carrier signal. At the time these changes occurred, point B changed with respect to the input terminal 13. As shown at (*d*) in Fig. 2, capacitor 23 discharges and recharges minus-plus almost instantly through diode 24. This action is evidenced at (*d*) and (*g*) in Fig. 2. Since capacitor 21 cannot discharge and recharge minus-plus through diode 22, it must do so through primary 26 and diode 24. This is shown at (*c*) of Fig. 2. This action produces an output pulse, as shown at (*e*) in Fig. 2, at the output terminals of secondary 27. The magnitude of the output pulse, assuming a 1:1 transformation ratio in transformer 25, is substantially equal to the change in potential of the input signal.

Just prior to time $T_5$, the input signal returns to its original level and point D is returned to a condition where it is positive with respect to point C. Under these circumstances, point B has again changed with respect to terminal 13. This causes capacitor 21 to discharge and recharge plus-minus through diode 22. Since capacitor 23 cannot discharge and recharge plus-minus through diode 24, it must do so through primary 26 and diode 22. In so doing, the current flow through primary 26 produces an output signal at the output terminals of secondary 27. It should be noted that the current flow through primary 26 is in the same direction whether capacitor 21 is discharging and recharging therethrough or whether capacitor 23 is discharging and recharging therethrough. Due to this fact, the output signals from secondary 27 are always unidirectional in nature, as evidenced at (*e*) in Fig. 2.

While the operation of the detector circuit 10 of the present invention has been described in combination with the switching device 11 for use in detecting only bipolar changes in the input potential level with respect to a reference potential, it is emphasized that when it is desired to detect a significant change of the potential level in the input, including a unilateral one, that the switching device may be deleted.

From the above-detailed description of the present invention it will be apparent that I have provided an improved detector circuit for producing a unidirectional output signal for the positive going and negative going portions of an input signal. The device is simple and may be constructed from solid state devices. It is not responsive to slow variations in input signal due to power supply drift and the like.

It should be pointed out that types of switching arrangements other than that illustrated by reference numeral 11 could be used in the present invention for the purpose of gating the input potential to the detector circuit so that the detection apparatus will be responsive to bipolar variations or pulse type inputs only. The essential feature of the invention is that the detector circuit 10 must see a high impedance at times when it is not desired to supply an input signal thereto. For example, a simple switch could comprise a movable contact and a fixed contact where the movable contact is adapted to periodically engage the fixed contact under the control of an electro-magnetic vibrator or chopper.

Further, it will be apparent that since the input signal, shown at (*b*) in Fig. 2, varies in a bipolar manner and has no unidirectional variations, it is possible to eliminate the switching device 11 and allow the input signal to directly control the direction of charge of capacitors 21 and 23. Another possibility is for the switching time to be at selected intervals which may or may not be equal.

While there have been shown and described and pointed out the fundamental novel features of the invention as applied to a preferred embodiment, it will be understood that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A detector circuit comprising first and second legs connected in parallel between first and second terminals, a bipolar input source with respect to a reference potential applied across said first and second terminals, each of said legs comprising a capacitor and a unidirectional conducting device, said unidirectional device in said first leg being reversely oriented with respect to the unidirectional device in the second leg and an output impedance connecting points intermediate said capacitor and unidirectional device in each leg for providing a unidirectional potential pulse each time said bipolar signal reverses polarity with respect to said reference potential, there being no point on said impedance connected directly to either of said terminals and no fixed bias potential connected to each of said points.

2. A detector circuit as set forth in claim 1 wherein said output impedance comprises the primary winding of an output transformer.

3. A detector circuit comprising first and second legs connected in parallel between first and second terminals, a bipolar input signal source with respect to a reference potential, periodic electronic sampling switching means arranged to receive said bipolar input signal source with respect to a reference potential and periodically apply said signal across said first and second terminals, each of said legs comprising a capacitor and a unidirectional conducting device, said unidirectional device in the first leg being reversely oriented with respect to the unidirectional device in the second leg and an output impedance connecting points intermediate the capacitor and unidirectional device in each leg for providing a unidirectional potential pulse each time said bipolar signal reverses polarity with respect to said reference potential, there being no point on said impedance connected directly to either of said terminals and no fixed bias potential connected to each of said points.

4. A detector circuit as set forth in claim 3, wherein said output impedance comprises the primary winding of an output transformer.

5. A detector circuit comprising first and second legs connected in parallel between first and second terminals and adapted to have a variable signal input with respect to a reference potential applied thereacross, each of said legs comprising a capacitor and a unidirectional conducting device, the last named device in the first leg being oriented oppositely to the similar device in the second leg and an output impedance connecting points intermediate said capacitor and unidirectional device in each leg and providing a unidirectional potential pulse each time the input potential level varies with respect to said reference potential, there being no point on said impedance connected directly to either of said terminals and no fixed bias potential connected to each of said points.

References Cited in the file of this patent

UNITED STATES PATENTS

| | | |
|---|---|---|
| 2,497,693 | Shea | Feb. 14, 1950 |
| 2,509,337 | Earp | May 30, 1950 |
| 2,778,933 | Crist | June 22, 1957 |

FOREIGN PATENTS

| | | |
|---|---|---|
| 622,128 | Great Britain | Apr. 27, 1949 |